US010706250B2

(12) United States Patent
Chen (10) Patent No.: US 10,706,250 B2
(45) Date of Patent: Jul. 7, 2020

(54) CAPACITIVE IMAGE SENSING DEVICE (71) Applicant: Novatek Microelectronics Corp., Hsinchu (TW)

(72) Inventor: Chi-Ting Chen, Hsinchu (TW)

(73) Assignee: Novatek Microelectronics Corp., Hsinchu (TW)

(*) Notice: Subject to any disclaimer, the term of this patent is extended or adjusted under 35 U.S.C. 154(b) by 50 days.

(21) Appl. No.: 15/993,613

(22) Filed: May 31, 2018

(65) Prior Publication Data

US 2018/0349666 A1 Dec. 6, 2018

Related U.S. Application Data (60) Provisional application No. 62/513,425, filed on May 31, 2017.

(51) Int. Cl.
| G06K 9/20 | (2006.01) |
| G06K 9/00 | (2006.01) |
| G01D 5/24 | (2006.01) |
| H03F 3/70 | (2006.01) |
| H03F 3/45 | (2006.01) |
| H03F 1/34 | (2006.01) |

(52) U.S. Cl.
CPC .............. *G06K 9/0002* (2013.01); *G01D 5/24* (2013.01); *G06K 9/0008* (2013.01); *H03F 1/34* (2013.01); *H03F 3/45* (2013.01); *H03F 3/45475* (2013.01); *H03F 3/70* (2013.01); *H03F 2200/261* (2013.01); *H03F 2203/45138* (2013.01); *H03F 2203/45514* (2013.01)

(58) Field of Classification Search
CPC .............. G06K 9/0002; G06K 9/00006–0012
See application file for complete search history.

(56) References Cited

U.S. PATENT DOCUMENTS

| 7,864,992 B2 | 1/2011 | Riedijk et al. | |
| 9,684,812 B2 | 6/2017 | Riedijk et al. | |
| 2005/0122785 A1* | 6/2005 | Umeda | G06K 9/0002 365/187 |
| 2005/0253598 A1* | 11/2005 | Kawahata | G06K 9/0002 324/671 |

(Continued)

FOREIGN PATENT DOCUMENTS

| CN | 104932743 | 9/2015 |
| CN | 106648198 | 5/2017 |

(Continued)

OTHER PUBLICATIONS

"Office Action of Taiwan Counterpart Application," dated Mar. 28, 2019, p. 1-p. 6.

*Primary Examiner* — Brian Werner
(74) *Attorney, Agent, or Firm* — JCIPRNET (57) ABSTRACT

A capacitive image sensing device is provided. The capacitive image sensing device includes a first charge amplifier, a second charge amplifier and a differential amplifier. The first charge amplifier is coupled to one of sensing electrodes of a sensor array. The differential amplifier has a first input terminal, a second input terminal and a differential output terminal pair. The first input terminal of the differential amplifier is coupled to the first charge amplifier. The second input terminal of the differential amplifier is coupled to the second charge amplifier.

8 Claims, 6 Drawing Sheets

(56) References Cited

U.S. PATENT DOCUMENTS

2015/0310248 A1    10/2015   Riedijk
2016/0180138 A1    6/2016   Riedijk
2016/0227142 A1*   8/2016   Lin .................... G06K 9/00013

FOREIGN PATENT DOCUMENTS

| TW | 201205403 | 2/2012 |
| TW | 201316236 | 4/2013 |

* cited by examiner

CAPACITIVE IMAGE SENSING DEVICE

CROSS-REFERENCE TO RELATED APPLICATION

This application claims the priority benefit of U.S. provisional application Ser. No. 62/513,425, filed on May 31, 2017. The entirety of the above-mentioned patent application is hereby incorporated by reference herein and made a part of this specification.

BACKGROUND

Field of the Invention

The invention relates to an image sensing device and more particularly, to a capacitive image sensing device.

Description of Related Art

A capacitive image sensing device, e.g., fingerprint sensing device, includes a sensor array consisting of sensing electrodes carrying charge of finger capacitance, a readout circuit that converts the charge into sensing signals, and an analog-to-digital converter that converts the sensing signals to digital signals with respect to a fingerprint image. However, the typical readout circuit is subject to the affection by noise (i.e., power noise) of a system voltage, which would result in failures of generating correct sensing signal.

SUMMARY

The invention provides a capacitive image sensing device capable of eliminating interference from power noise by a symmetric readout circuit structure.

According to an embodiment of the invention, a capacitive image sensing device is provided. The capacitive image sensing device includes a first charge amplifier, a second charge amplifier and a differential amplifier. The first charge amplifier is coupled to one of a plurality of sensing electrodes of a sensor array. The differential amplifier has a first input terminal, a second input terminal and a differential output terminal pair. A first input terminal of the differential amplifier is coupled to the first charge amplifier. A second input terminal of the differential amplifier is coupled to the second charge amplifier.

Based on the above, the capacitive image sensing device provided by the embodiments of the invention uses two charge amplifiers with the similar circuit structure. The first charge amplifier is configured to receive a sensing result corresponding to one of the sensing electrodes of the sensor array and provide a sensing signal to the first input terminal of the differential amplifier. The second charge amplifier is configured to provide a reference voltage signal to the second input terminal of the differential amplifier. With the symmetric readout circuit structure, the capacitive image sensing device can effectively eliminate or reduce the interference from the power noise.

According to another embodiment of the invention, a capacitive image sensing device is provided. The capacitive image sensing device includes a sensor array including a plurality of sensing electrodes and a plurality of reference electrodes, wherein the plurality of reference electrodes are disposed in a center region of the sensor array.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A term "couple" used in the full text of the disclosure (including the claims) refers to any direct and indirect connections. For instance, if a first device is described to be coupled to a second device, it is interpreted as that the first device is directly coupled to the second device, or the first device is indirectly coupled to the second device through other devices or connection means. Moreover, wherever possible, elements/members/steps using the same referral numerals in the drawings and description refer to the same or like parts. Elements/members/steps using the same referral numerals or using the same terms in different embodiments may cross-refer related descriptions.

Figure 1:
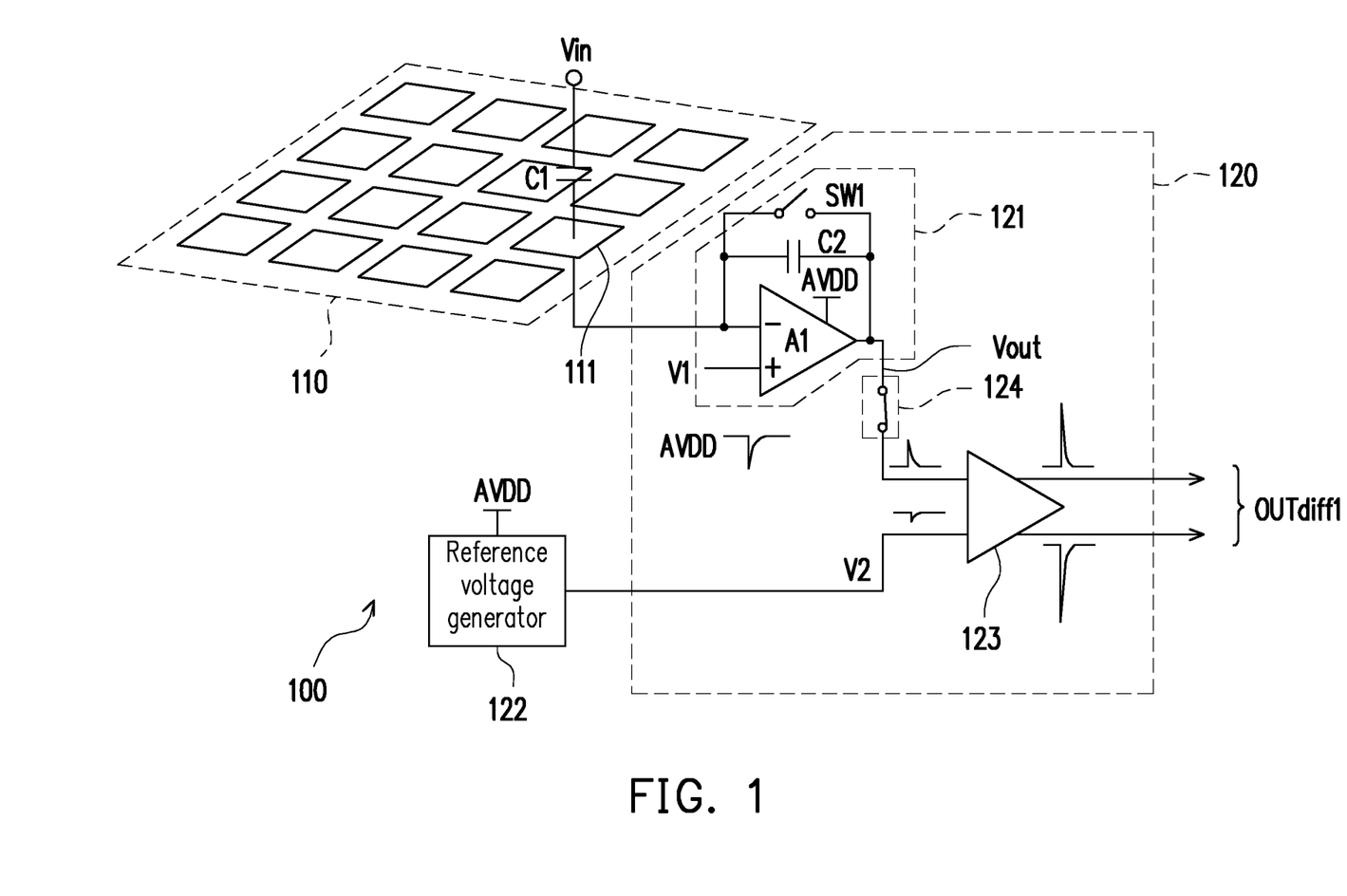
FIG. 1 is a schematic circuit block illustrating a capacitive image sensing device.

FIG. 1 is a schematic circuit block illustrating a capacitive image sensing device 100. The capacitive image sensing device 100 includes a sensor array 110 and a readout circuit 120. The sensor array 110 includes a plurality of sensing electrodes. The readout circuit 120 includes a plurality of charge amplifiers 121 respectively corresponding to the sensing electrodes and a single-to-differential amplifier (which is referred to as a differential amplifier hereinafter) 123. For the illustrative convenience, only one charge amplifier 121 is shown in FIG. 1. Each of the sensing electrodes is electrically coupled to an input terminal of a corresponding charge amplifier 121. For instance, a sensing electrode 111 illustrated in FIG. 1 is electrically coupled to a corresponding charge amplifier 121. In some embodiments, the readout circuit 120 may be implemented in an integrated circuit, and the sensor array 110 may be implemented as another integrated circuit. In some other embodiments, the readout circuit 120 and the sensor array 110 may be integrated in one integrated circuit.

The charge amplifier 121 includes an operational amplifier A1, a feedback capacitor C2 and a reset switch SW1. The operational amplifier A1 has an inverting input terminal, a non-inverting input terminal and an output terminal. The inverting input terminal of the operational amplifier A1 is employed as an input terminal of the charge amplifier 121. The non-inverting input terminal of the operational amplifier A1 is coupled to a reference voltage V1. The output terminal of the operational amplifier A1 is coupled to a first input terminal of the differential amplifier 123. The feedback capacitor C2 is coupled between the inverting input terminal of the operational amplifier A1 and the output terminal of the operational amplifier A1. The reset switch SW1 is coupled between the inverting input terminal of the operational amplifier A1 and the output terminal of the operational amplifier A1, for discharging the feedback capacitor C2. The reset switch SW1 is turn off during the charge amplifier 121 is measuring charge carried by the sensing electrode 111.

The charge amplifier 121 is configured to receive an input voltage signal Vin that is a signal on a finger which touches the capacitive image sensing device 100, and to amplify the input voltage signal Vin to generate an output voltage signal Vout. The input voltage signal Vin may be generated when a periodic driving signal or a constant voltage is coupled to the finger through a conducting element such as a metal ring (bezel) of the capacitive image sensing device 100. The input voltage signal Vin is taken as a sensing result corresponding to the sensing electrode 111 and is associated with charges of a capacitance C1 formed between the finger and the sensing electrode 111. More precisely, the capacitance C1 is formed between a fingerprint ridge or a fingerprint valley and the sensing electrode 111. The output voltage signal Vout is taken as a sensing signal output by the charge amplifier 121. An amplification ratio of the charge amplifier 121 is determined according to the capacitance C1 and a capacitance of the feedback capacitor C2, i.e., the output voltage signal Vout=Vin*(C1/C2).

The first input terminal of the differential amplifier 123 is coupled to the output terminals of charge amplifiers corresponding to the sensing electrodes through a multiplex circuit (switches) 124. For instance, when the multiplex circuit 124 electrically couples an output terminal of the charge amplifier 121 to the first input terminal of the differential amplifier 123, the charge amplifier 121 transmits the sensing signal (i.e., the output voltage signal Vout) with respect to the sensing electrode 111 to the first input terminal of the differential amplifier 123 through the multiplex circuit 124. The second input terminal of the differential amplifier 123 is coupled to a reference voltage V2 generated by a reference voltage generator 122. The differential amplifier 123 may convert the sensing signal which is as a single-ended signal output by the charge amplifier 121 into a differential output signal OUTdiff1 and then, provide the differential output signal OUTdiff1 to a next-stage circuit. The next-stage circuit may be another differential amplifier or an analog-to-digital converter.

However, any unideal common-mode disturbance would cause abnormal jitter of the output of a single-ended circuit such as the charge amplifier 121. The charge amplifier 121 and the reference voltage generator 122 are supplied with a system voltage AVDD but have different operation characteristics. The charge amplifier 121 is configured to receive the input voltage signal Vin which is the sensing result from the sensing electrode, while the reference voltage generator 122 is configured to generate a stabilized reference voltage V2. Generally, the reference voltage generator 122 may be a unity gain buffer. A power supply rejection ratio (PSRR) of the reference voltage generator 122 is different from a PSRR of the charge amplifier 121. Thus, input signals of the differential amplifier 123 may be easily interfered by noise in the system voltage AVDD, which further causes the differential output signal OUTdiff1 of the differential amplifier 123 to be easily interfered by noise in the system voltage AVDD as well.

Referring to FIG. 1, the system voltage AVDD may supply power to the charge amplifier 121, the reference voltage generator 122 and other elements. When negative pulse noise occurs in the system voltage AVDD, negative pulse noise appears in the reference voltage V2 of the reference voltage generator 122, and positive pulse noise appears in the sensing signal (i.e., the output voltage signal Vout) output by the charge amplifier 121. A voltage difference (i.e., a differential input signal of the differential amplifier 123) between the reference voltage V2 and the sensing signal is amplified by the differential amplifier 123, as illustrated in FIG. 1, thereby the voltage difference resulted from the noise is amplified as well. Namely, the readout circuit 120 easily amplifies the noise on the system voltage AVDD such that the differential output signal OUTdiff1 output by the differential amplifier 123 carries significant noise.

Figure 2:
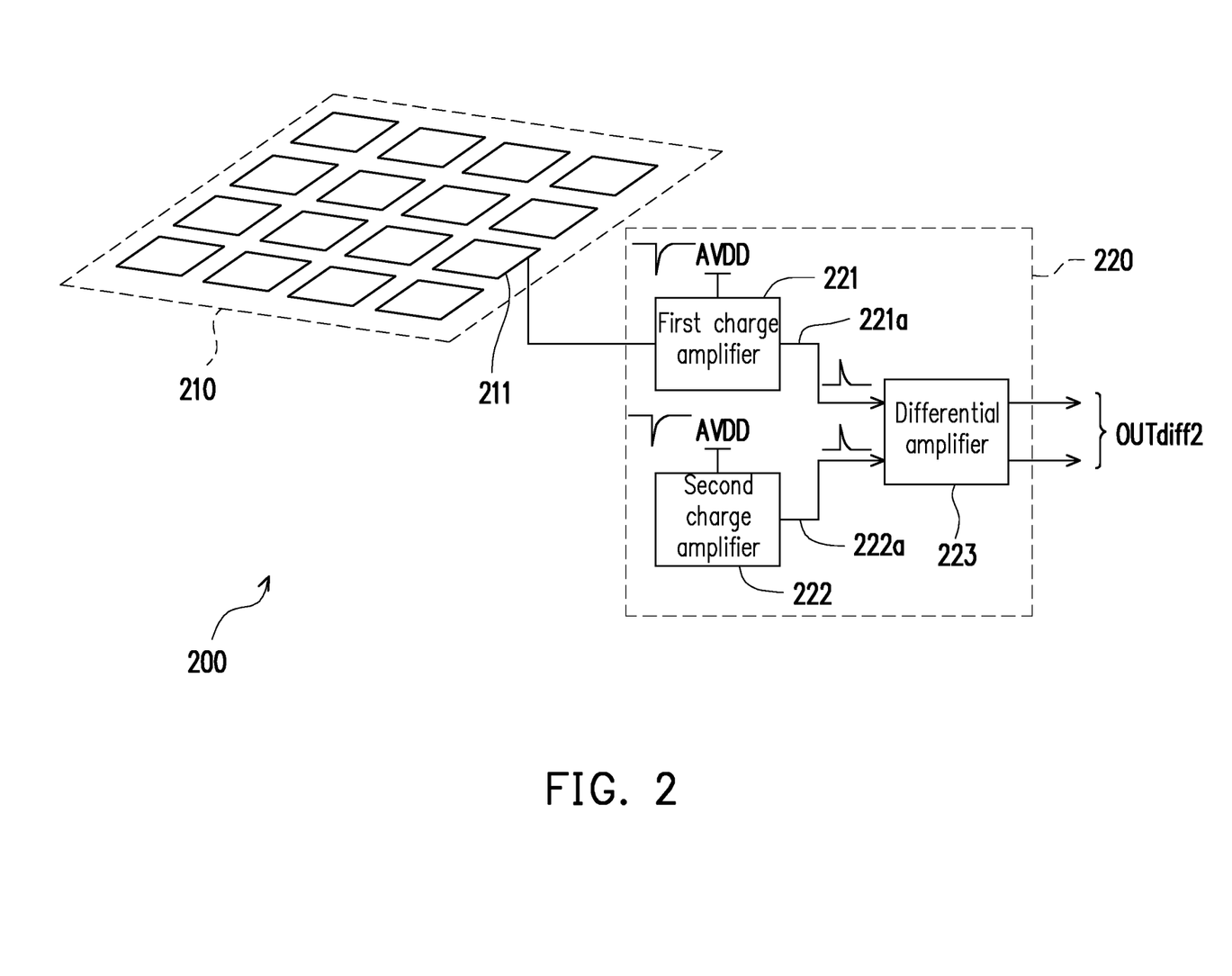
FIG. 2 is a schematic circuit block illustrating a capacitive image sensing device according to an embodiment of the invention.

FIG. 2 is a schematic circuit block illustrating a capacitive image sensing device 200 according to an embodiment of the invention. The capacitive image sensing device 200 includes a sensor array 210 and a readout circuit 220. The sensor array 210 illustrated in FIG. 2 may be inferred with reference to the related description of the sensor array 110 illustrated in FIG. 1 and thus, will not be repeated. The readout circuit 220 includes a plurality of first charge amplifiers 221 respectively corresponding to sensing electrodes of the sensor array 210, a second charge amplifier 222, and a differential amplifier 223. For the illustrative convenience, only one first charge amplifier 221 is shown in FIG. 2. Each of the sensing electrodes is electrically coupled to an input terminal of a corresponding first charge amplifier 221. For instance, a sensing electrode 211 illustrated in FIG. 2 is electrically coupled to a corresponding first charge amplifier 221. In some embodiments, the readout circuit 220 may be implemented as an integrated circuit, while the sensor array 210 may be implemented as another. In some other embodiments, the readout circuit 220 and the sensor array 210 may be integrated in one integrated circuit.

Though not shown in FIG. 2, the first charge amplifier 221 may include an operational amplifier, a feedback capacitor and a reset switch, which are similar to the charge amplifier 121 of FIG. 1. The first charge amplifier 221 is configured to receive an input voltage signal that is a signal on a finger which touches a capacitive image sensing device 100, and to amplify the input voltage signal to generate an output voltage signal. The input voltage signal is taken as a sensing result corresponding to the sensing electrode 211 and is related to charge of a capacitance formed between the finger and the sensing electrode 211. The output voltage signal is taken as a sensing signal output by the first charge amplifier 221. The differential amplifier 223 has a first input terminal, a second input terminal and a differential output terminal pair. In some embodiments, the readout circuit 220 may have only one differential amplifier 223 and sensing signals from the plurality of first charge amplifiers 221 are time-divisionally output to the first input terminal of the differential amplifier 223 via a multiplex circuit (not shown in FIG. 2). For example, in a certain time period, the first input terminal of the differential amplifier 223 is coupled to an output terminal of the first charge amplifier 221 to receive a sensing signal 221a. In some other embodiments, the readout circuit 220 may have several differential amplifiers 223, each differential amplifier time-divisionally receiving sensing signals output from a part of the plurality of first charge amplifiers 221.

A second input terminal of the differential amplifier 223 is coupled to an output terminal of the second charge amplifier 222 to receive a reference voltage signal 222a. The differential amplifier 223 may convert the sensing signal 221a output from the first charge amplifier 221 into a differential output signal OUTdiff2 and then, provide the differential output signal OUTdiff2 to a next-stage circuit (not shown) through the differential output terminal pair of the differential amplifier 223. The differential amplifier 223 illustrated in FIG. 2 may be inferred with reference to the related description of the differential amplifier 123 illustrated in FIG. 1 and thus, will not be repeated.

The first charge amplifier 221 and the second charge amplifier 222 have similar operation characteristics. For instance, a PSRR of the second charge amplifier 222 is close to a PSRR of the first charge amplifier 221. The system voltage AVDD may supply power to the first charge amplifier 221, the second charge amplifier 222 and other elements. When negative pulse noise occurs in the system voltage AVDD, positive pulse noise appears in the sensing signal 221a output by the first charge amplifier 221, and positive pulse noise also appears in the reference voltage signal 222a output by the second charge amplifier 222. In other words, common-mode noise appears in the two input signals of the differential amplifier 223. Based on differential-mode characteristics of the differential amplifier 223, the common-mode noise may be offset, and thus, the common-mode noise does not affect the differential output signal OUTdiff2 output by the differential amplifier 223. Thus, the readout circuit 220 illustrated in FIG. 2 may effectively eliminate interference from the power noise.

Figure 3:
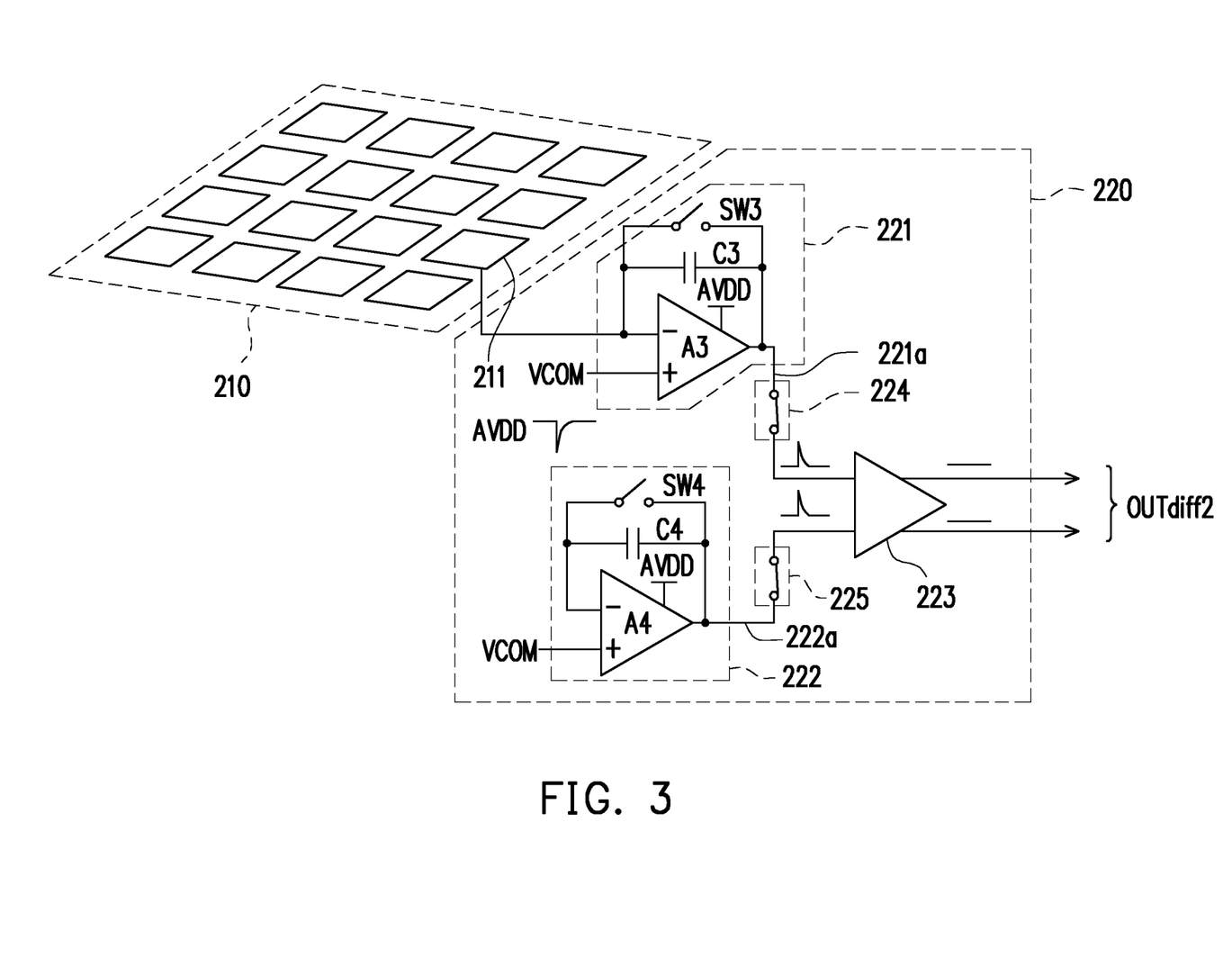
FIG. 3 is a schematic circuit block illustrating the first charge amplifier and the second charge amplifier depicted in FIG. 2 according to an embodiment of the invention.

FIG. 3 is a schematic circuit block illustrating the first charge amplifier 221 and the second charge amplifier 222 depicted in FIG. 2 according to an embodiment of the invention. The sensor array 210 illustrated in FIG. 3 may be inferred with reference to the related description of the sensor array 110 illustrated in FIG. 1 and thus, will not be repeated.

In the embodiment illustrated in FIG. 3, the first charge amplifier 221 includes an operational amplifier A3, a feedback capacitor C3 and a reset switch SW3. The operational amplifier A3 has an inverting input terminal, a non-inverting input terminal and an output terminal. The inverting input terminal of the operational amplifier A3 is coupled to the sensing electrode 211 of the sensor array 210. The non-inverting input terminal of the operational amplifier A3 is coupled to a reference voltage signal VCOM. A level of the reference voltage signal VCOM may be determined based on a design requirement. The output terminal of the operational amplifier A3 is coupled to the first input terminal of the differential amplifier 223. The feedback capacitor C3 is coupled between the inverting input terminal of the operational amplifier A3 and the output terminal of the operational amplifier A3. The reset switch SW3 is coupled between the inverting input terminal of the operational amplifier A3 and the output terminal of the operational amplifier A3. The first charge amplifier 221 illustrated in FIG. 3 may be inferred with reference to the related description of the charge amplifier 121 illustrated in FIG. 1 and thus, will not be repeated.

In the embodiment illustrated in FIG. 3, the second charge amplifier 222 includes an operational amplifier A4, a feedback capacitor C4 and a reset switch SW4. The operational amplifier A4 has an inverting input terminal, a non-inverting input terminal and an output terminal. The inverting input terminal of the operational amplifier A4 is not coupled to any sensing electrode. The non-inverting input terminal of the operational amplifier A4 is coupled to the reference voltage signal VCOM. The output terminal of the operational amplifier A4 is coupled to the second input terminal of the differential amplifier 223. The feedback capacitor C4 is coupled between the inverting input terminal of the operational amplifier A4 and the output terminal of the operational amplifier A4. The reset switch SW4 is coupled between the inverting input terminal of the operational amplifier A4 and the output terminal of the operational amplifier A4.

The readout circuit 220 may allow the differential amplifier 223 to time-divisionally receive sensing signals output by the plurality of first charge amplifiers 221. For instance, a multiplex circuit (switches) 224 capable of time-divisionally controlling may be disposed between the output terminals of the first charge amplifiers 221 and the first input terminal of the differential amplifier 223. For the circuit symmetry, a switch 225 may be disposed between the output terminal of the second charge amplifier 222 and the second input terminal of the differential amplifier 223. The readout circuit 220 may have one or a plurality of second charge amplifiers 222, and each second charge amplifier 222 may provide a reference voltage signal to a corresponding differential amplifier. Alternatively, each second charge amplifier 222 may provide the reference voltage signal to a plurality of differential amplifiers. It should be noted that the numbers of the second charge amplifiers 222 and the corresponding relation between the differential amplifiers and the second charge amplifiers 222 are not limited in the embodiments of the invention.

During a reset period with respect to the sensing electrode 211, the multiplex circuit 224 disconnects the output terminal of the first charge amplifier 221 from the first input terminal of the differential amplifier 223, and the reset switch SW3 are turn on. Thereby, charges of the feedback capacitor C3 and the feedback capacitor C4 may be reset. During the reset period with respect to the sensing electrode 211, the reset switch SW4 of the second charge amplifier 222 may be turn off and the switch 225 may be turned on, for a sensing period with respect to the other sensing electrode. During a sensing period with respect to the sensing electrode 211, the multiplex circuit 224 electrically connects the output terminal of the first charge amplifier 221 to the first input terminal of the differential amplifier 223, and the reset switch SW3 is turned off. Thereby, the first charge amplifier 221 forms a unity gain buffer, such that the first charge amplifier 221 may receive the sensing result with respect to the sensing electrode 211 and output the sensing signal 221a to the first input terminal of the differential amplifier 223. During the sensing period with respect to the sensing electrode 211, the reset switch SW4 is turned off and the switch 225 is turned on. Thereby, the second charge amplifier 222 may provide the reference voltage signal 222a to the second input terminal of the differential amplifier 223, such that the differential amplifier 223 may convert the sensing signal 221a output by the first charge amplifier 221 into the differential output signal OUTdiff2 and then provide the differential output signal OUTdiff2 to a next-stage circuit (not shown) through the differential output terminal pair of the differential amplifier 223.

In the embodiment illustrated in FIG. 3, the circuit structure of the second charge amplifier 222 configured to provide the reference voltage signal is similar to (or the same as) the circuit structure of the first charge amplifier 221 configured to receive the sensing result from the sensing electrode and generate the sensing signal output to the differential amplifier 223. Thus, the PSRR of the second charge amplifier 222 is similar to (or the same as) the PSRR of the first charge amplifier 221. Referring to FIG. 3, the system voltage AVDD may supply power to the first charge amplifier 221, the second charge amplifier 222 and other elements. When negative pulse noise occurs in the system voltage AVDD, positive pulse noise appears in the reference voltage signal 222a provided by the second charge amplifier 222 and also appears in the sensing signal 221a output by the first charge amplifier 221. In other words, the common-mode noise occurs in the two input signals of the differential amplifier 223. Based on differential-mode characteristics of the differential amplifier 223, the common-mode noise may be offset, and thus, the common-mode noise does not affect the differential output signal OUTdiff2 output by the differential amplifier 223. Thus, the structure of the readout circuit illustrated in FIG. 3 may effectively eliminate the interference from the power noise.

Figure 4:
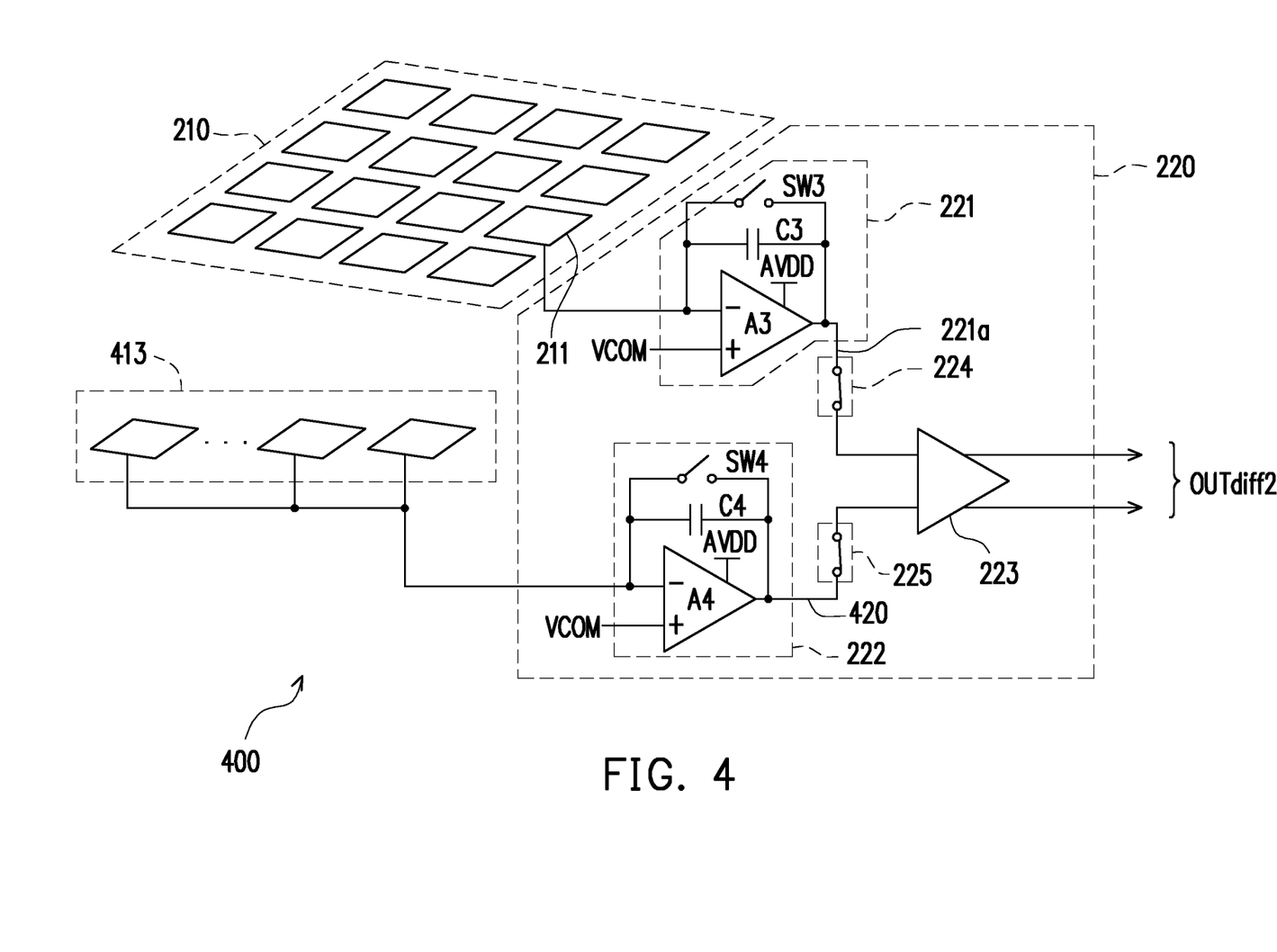
FIG. 4 is a schematic circuit block illustrating a capacitive image sensing device according to another embodiment of the invention.

FIG. 4 is a schematic circuit block illustrating a capacitive image sensing device 400 according to another embodiment of the invention. The capacitive image sensing device 400 includes a sensor array 210 and a readout circuit 220. The sensor array 210 illustrated in FIG. 4 may be inferred with reference to the related description of the sensor array 210 illustrated in FIG. 3 and thus, will not be repeated.

In the embodiment illustrated in FIG. 4, the readout circuit 220 of the capacitive image sensing device 400 includes a first charge amplifier 221, a second charge amplifier 222, a differential amplifier 223 and a multiplex circuit 224. The first charge amplifier 221, the second charge amplifier 222, the differential amplifier 223 and the multiplex circuit 224 illustrated in FIG. 4 may be inferred with reference to the related description of the first charge amplifier 221, the second charge amplifier 222, the differential amplifier 223 and the multiplex circuit 224 illustrated in FIG. 3 and thus, will not be repeated.

In the embodiment illustrated in FIG. 4, an inverting input terminal of the operational amplifier A4 of the second charge amplifier 222 is coupled to one or a plurality of reference electrodes 413. The reference electrodes 413 are not coupled to the first charge amplifiers 221 of the readout circuit 220. The number of the reference electrodes 413 and the position of the one or more reference electrodes 413 illustrated in FIG. 4 may be determined based on a design requirement. For instance, in some embodiments, the reference electrodes 413 may be disposed outside the sensor array 210 and close to the sensor array 210. In some other embodiments, the reference electrodes 413 may be disposed inside the sensor array 210, which means the sensor array 210 includes a plurality of sensing electrodes and a plurality of reference electrodes 413. In such as case, the reference electrodes 413 may be disposed in a center region of the sensor array 210. In still other embodiments, the reference electrodes 413 may be disposed in different regions of the sensor array 210. For instance, there are a plurality of reference electrodes 413 in a center region of the sensor array 210, while there are also a plurality of reference electrodes 413 in a peripheral region of the sensor array 210.

Behaviors of the first charge amplifier 221 and the second charge amplifier 222 in FIG. 4 during the reset period and the sensing period with respect to the sensing electrode 211 may be inferred with reference to the related description of the same elements in FIG. 3, and will not be repeated. It is assumed herein that the sensor array 210 is configured to sense a fingerprint image. When the finger approaches the sensor array 210, some of the sensing electrodes of the sensor array 210 sense a ridge of the fingerprint, and other sensing electrodes of the sensor array 210 sense a valley of the fingerprint. Thus, the sensing electrode 211 in FIG. 4 may sense the ridge or valley of the fingerprint. The first charge amplifier 221 may receive a sensing result with respect to a capacitance between the ridge or valley of the fingerprint and the sensing electrode 211 and output a sensing signal 221a to the first input terminal of the differential amplifier 223. The second charge amplifier 222 may receive a reference sensing result with respect to a plurality of capacitances between the fingerprint and the reference electrodes 413 and output a reference sensing signal 420 to the second input terminal of the differential amplifier 223. It is noted that if the number of the reference electrodes 413 is N (larger than 1), the capacitance of the capacitor C4 illustrated in FIG. 4 is N times the capacitance of the capacitor C4 in FIG. 3. Consequently, the reference sensing signal 420 is corresponding to an average capacitance with respect to ridges and valleys of the fingerprint. As the reference sensing signal 420 and the sensing signal 221a are both generated based on sensing results from the electrodes, noise appearing in the reference sensing signal 420 may be approximate to noise appearing in the sensing signal 221a. Therefore, common-mode noise may be eliminated in the differential amplifier 223.

Figure 5:
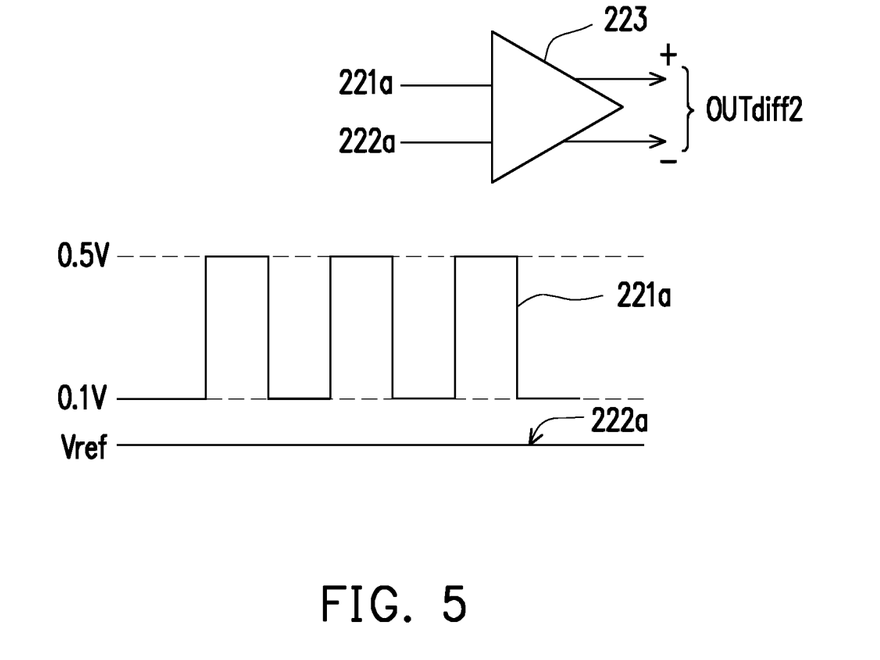
FIG. 5 is a schematic waveform of the input signal of the differential amplifier depicted in FIG. 3.
Figure 6:
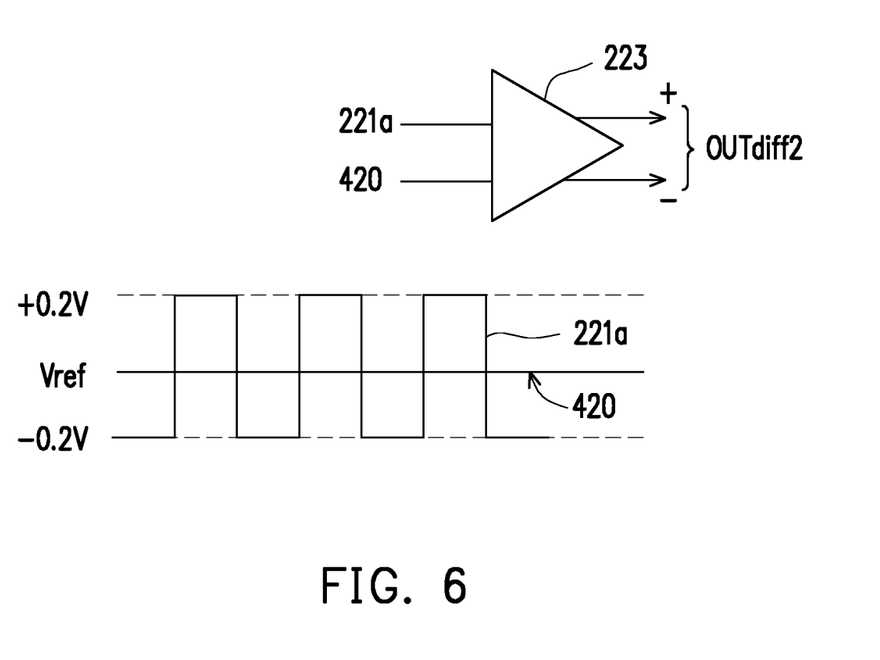
FIG. 6 is a schematic waveform of the input signal of the differential amplifier depicted in FIG. 4.

FIG. 5 and FIG. 6 illustrate operations of the differential amplifier 223 in different embodiments for comparison. FIG. 5 is a schematic waveform of the input signal of the differential amplifier 223 depicted in FIG. 3. FIG. 6 is a schematic waveform of the input signal of the differential amplifier 223 depicted in FIG. 4. In FIG. 5 and FIG. 6, the horizontal axis represents positions of the sensing electrode, and the vertical axis represents voltage level of the input signals of the differential amplifier 223.

Referring to FIG. 3 and FIG. 5, the input signals of the differential amplifier 223 are the sensing signal 221a and the reference voltage signal 222a. In the example illustrated in FIG. 3, a level of the reference voltage signal 221a, denoted as Vref (such as 0V), follows the voltage level of the non-inverting input terminal of the operational amplifier A4. It is assumed that a level of the sensing signal 221a corresponding to a fingerprint ridge position is 0.5 V, and the level of the sensing signal 221a corresponding to a fingerprint valley position is 0.1 V. Thus, a differential input signal of the differential amplifier 223 contains a DC offset component. The DC offset component is amplified by the differential amplifier 223, and the amplified DC offset component has to be filtered by an additional circuit.

Referring to FIG. 4 and FIG. 6, the input signals of the differential amplifier 223 are the sensing signal 221a and the reference sensing signal 420. In the example illustrated in FIG. 6, it is assumed that the level of the sensing signal 221a corresponding to the fingerprint ridge position is +0.2 V, the level of the sensing signal 221a corresponding to the fingerprint valley position is −0.2 V. Since the reference sensing signal 420 is corresponding to an average capacitance with respect to ridges and valleys of the fingerprint, the level of the reference sensing signal 420, denoted as Vref, may be approximate to the average of the levels of the sensing signal 221a corresponding to the fingerprint ridge positions and the fingerprint valley positions, as illustrated in FIG. 6. In this scenario, the DC offset component contained in the differential input signal of the differential amplifier 223 may be significantly reduced, and the differential input signal is approximate to an AC signal without DC offset component. According to the embodiment illustrated in FIG. 4, the reference sensing signal 420 may be adaptively changed according to the application environment of the sensor array 210. In this way, the DC offset component which is not required to be amplified may be eliminated as early as possible.

In another embodiment of the invention, the second charge amplifier 222 with no input signal in the embodiment illustrated in FIG. 3 and the reference electrodes 413 in the embodiment illustrated in FIG. 4 may coexist in a capacitive image sensing device. Whether the inverting input terminal of the second charge amplifier 222 has no input signal or receives sensing results from the reference electrode 413 may be determined by a switch circuit (not shown).

Figure 7:
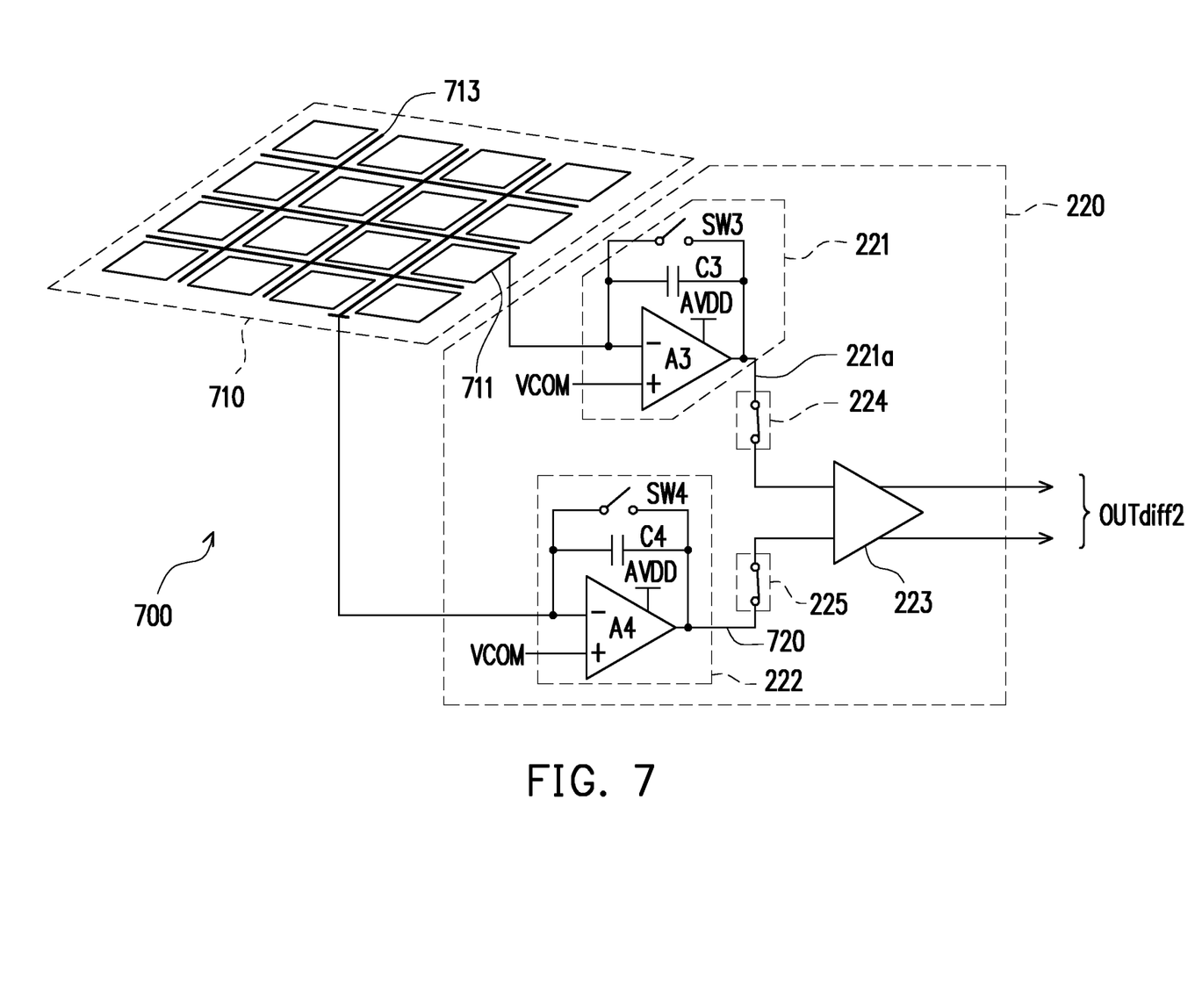
FIG. 7 is a schematic circuit block illustrating a capacitive image sensing device according to yet another embodiment of the invention.

FIG. 7 is a schematic circuit block illustrating a capacitive image sensing device 700 according to yet another embodiment of the invention. The capacitive image sensing device 700 includes a sensor array 710, a reference electrode 713, and a readout circuit 220. The sensor array 710 illustrated in FIG. 7 may be inferred with reference to the related description of the sensor array 210 illustrated in FIG. 3, the readout circuit 220 illustrated in FIG. 7 may be inferred with reference to the related description of the readout circuit 220 illustrated in FIG. 3, and thus, they will not be repeatedly described.

The inverting input terminal of the operational amplifier A4 of the second charge amplifier 222 is coupled to the reference electrode 713. The second charge amplifier 222 is configured to output a reference sensing signal 720 to the second input terminal of the differential amplifier 223. In the embodiment illustrated in FIG. 7, the reference electrode 713 may be a part of a shielding grid that is used for shielding each sensing electrode from another. The shielding grid is made of conducting material. The reference electrode 713 may include one or a plurality of conductive lines between sensing electrodes of the sensor array 710. As illustrated in FIG. 7, the conductive lines are disposed between every two adjacent sensing electrodes and the conductive lines are electrically connected with each other to form a grid conductor (i.e., the reference electrode 713). In another embodiment, the conductive lines of the reference electrode 713 may be disposed in any other patterns. When an object (e.g., a finger) touches the capacitive image sensing device 700, a capacitance is formed between a ridge (or a valley) of the fingerprint and a sensing electrode 711 of the sensor array 710, and a capacitance is also is formed between the ridges and the valleys of the fingerprint and the reference electrode 713 as a grid conductor. The first charge amplifier 221 receives a sensing result from the sensing electrode 711 and outputs the sensing signal 221*a* to the first input terminal of the differential amplifier 223. The second charge amplifier 222 receives a reference sensing result from the reference electrode 713 and outputs the reference sensing signal 720 to the second input terminal of the differential amplifier 223. Being similar to the embodiments illustrated in FIG. 4 and FIG. 6, the reference sensing signal 720 received by the differential amplifier 223 illustrated in FIG. 7 may also contribute to reducing the DC offset component contained in the differential input signal.

In another embodiment of the invention, the second charge amplifier 222 with no input signal in the embodiment illustrated in FIG. 3 and the reference electrode 713 illustrated in FIG. 7 may coexist in a capacitive image sensing device. Whether the inverting input terminal of the second charge amplifier 222 has no input signal or receives a sensing result from the reference electrode 713 may be determined by a switch circuit (not shown).

In light of the foregoing, the capacitive image sensing device provided by the embodiments of the invention uses two charge amplifiers with the similar circuit structure. The first charge amplifier is configured to receive a sensing result from the sensing electrode of the sensor array and provides a sensing signal to the first input terminal of the differential amplifier. The second charge amplifier is configured to provide the reference voltage signal or the reference sensing signal to the second input terminal of the differential amplifier. With the symmetric readout circuit structure, the capacitive image sensing device can effectively eliminate the interference from the power noise.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A capacitive image sensing device, comprising:
   a sensor array, comprising a plurality of sensing electrodes and a plurality of reference electrodes; and
   a readout circuit, comprising:
      a first charge amplifier, coupled to one of the plurality of sensing electrodes of the sensor array;
      a second charge amplifier, coupled to a first node disposed outside the readout circuit, wherein the first node disposed outside the readout circuit is connected to all of the plurality of reference electrodes; and
      a differential amplifier, having a first input terminal, a second input terminal and a differential output terminal pair, wherein the first input terminal of the differential amplifier is coupled to the first charge amplifier and the second input terminal of the differential amplifier is coupled to the second charge amplifier.

2. The capacitive image sensing device according to claim 1, wherein the first charge amplifier comprises:
   an operational amplifier, having an inverting input terminal, a non-inverting input terminal and an output terminal, wherein the inverting input terminal of the operational amplifier is coupled to the sensing electrode of the sensor array, the non-inverting input terminal of the operational amplifier is coupled to a reference voltage signal, and the output terminal of the operational amplifier is coupled to the first input terminal of the differential amplifier;
   a feedback capacitor, coupled between the inverting input terminal of the operational amplifier and the output terminal of the operational amplifier; and
   a reset switch, coupled between the inverting input terminal of the operational amplifier and the output terminal of the operational amplifier.

3. The capacitive image sensing device according to claim 1, wherein the second charge amplifier comprises:
   an operational amplifier, having an inverting input terminal, a non-inverting input terminal and an output terminal, wherein the non-inverting input terminal of the operational amplifier is coupled to a reference voltage signal, and the output terminal of the operational amplifier is coupled to the second input terminal of the differential amplifier;
   a feedback capacitor, coupled between the inverting input terminal of the operational amplifier and the output terminal of the operational amplifier; and a reset switch, coupled between the inverting input terminal of the operational amplifier and the output terminal of the operational amplifier.

4. The capacitive image sensing device according to claim 3, wherein the inverting input terminal of the operational amplifier of the second charge amplifier is coupled to the plurality of reference electrodes and the operational amplifier of the second charge amplifier is configured to output a reference sensing signal to the second input terminal of the differential amplifier.

5. The capacitive image sensing device according to claim 1, wherein an inverting input terminal of the second charge amplifier is coupled to the plurality of reference electrodes and the second charge amplifier is configured to output a reference sensing signal to the second input terminal of the differential amplifier.

6. The capacitive image sensing device according to claim 5, wherein the plurality of reference electrodes are separated from the plurality of sensing electrodes and disposed close to the plurality of sensing electrodes.

7. The capacitive image sensing device according to claim 5, wherein each of the plurality of reference electrodes is at least one conductive line disposed between the plurality of sensing electrodes of the sensor array.

8. The capacitive image sensing device according to claim 7, wherein t each of the plurality of reference electrodes is a shielding grid disposed between the sensing electrodes of the sensor array, and the shielding grid is grounded or connected to other voltage levels.

* * * * *